United States Patent [19]

Hiro et al.

[11] Patent Number: 5,279,923
[45] Date of Patent: Jan. 18, 1994

[54] POSITIVE TYPE PHOTOSENSITIVE ANIONIC ELECTRODEPOSITION COATING RESIN COMPOSITION

[75] Inventors: Masahiko Hiro; Toshihiko Akahori; Shigeo Tachiki, all of Hitachi, Japan

[73] Assignee: Hitachi Chemical Company, Ltd., Tokyo, Japan

[21] Appl. No.: 982,559

[22] Filed: Nov. 27, 1992

[30] Foreign Application Priority Data

Nov. 27, 1991 [JP] Japan .................. 3-312512

[51] Int. Cl.$^5$ .............................. G03C 1/492
[52] U.S. Cl. .................. 430/270; 430/326; 522/27; 522/31; 522/49; 522/50; 522/59; 522/63
[58] Field of Search .......... 430/270, 526; 522/31, 522/27, 49, 50, 59, 63

[56] References Cited

U.S. PATENT DOCUMENTS

| | | | |
|---|---|---|---|
| 5,037,721 | 8/1991 | Doessel | 430/270 |
| 5,093,221 | 3/1992 | Chen et al. | 430/270 |
| 5,102,771 | 4/1992 | Vogel et al. | 430/270 |
| 5,110,708 | 5/1992 | Kim | 430/270 |
| 5,212,046 | 5/1993 | Ganola et al. | 430/270 |
| 5,217,843 | 6/1993 | Dammet et al. | 430/270 |
| 5,225,316 | 7/1993 | Vogel et al. | 430/270 |
| 5,227,276 | 7/1993 | Roeschekt et al. | 430/270 |

FOREIGN PATENT DOCUMENTS 0489560 2/1991 European Pat. Off. .
59-3740 1/1984 Japan .

*Primary Examiner*—Jack P. Brammer
*Attorney, Agent, or Firm*—Antonelli, Terry, Stout & Kraus

[57] ABSTRACT

A photosensitive resin composition comprising (a) a compound having a group unstable to acids, (b) a compound generating an acid when exposed to actinic light, and (c) a benzotriazole derivative is suitable for forming a positive type photosensitive anionic electrodeposition coating material and is usable for producing printed circuit boards.

9 Claims, No Drawings

POSITIVE TYPE PHOTOSENSITIVE ANIONIC ELECTRODEPOSITION COATING RESIN COMPOSITION

BACKGROUND OF THE INVENTION

This invention relates to a positive type photosensitive anionic electrodeposition coating resin composition, a positive type photosensitive anionic electrodeposition coating material, an electrodeposition coating bath, an electrodeposition coating process and a process for producing printed circuit boards.

In production of printed circuit boards, first a layer of a photosetting resin composition is formed on a substrate, then the layer is irradiated imagewise with actinic light, and uncured portions are removed by development to form a resist pattern. In this process, various methods are employed for forming a layer of a photosetting resin composition. For example, there are known a method in which a solution of a photosetting resin composition (coating solution) is coated on a substrate by dip coating, roll coating, curtain coating or other coating techniques, and a method in which a film of a photosetting resin composition (photosensitive film) is laminated on a substrate. Among these methods, the method comprising laminating a photosensitive film is now predominantly used in the art as this method is capable of forming a photosetting resin composition layer with uniform thickness by a simple operation.

With a recent tendency toward higher density and higher precision of printed circuit boards, request is growing for the resist patterns of higher quality. That is, there are required resist patterns which are free of pin holes and have good adhesion to the underlying substrate surface. It is understood that the method comprising laminating a photosensitive film, which is now prevalently used, has a limit in meeting said request. According to this method, conformability to unevenness of substrate surface caused by scars at the time of substrate production, ununiformity of polishing, interstice of glass cloth forming an inner layer of the substrate, ununiformity of pits in copper plating on the surface, etc., is poor, and it is difficult to obtain sufficient adhesiveness. Such difficulty can be removed to some extent by carrying out the lamination of photosensitive film under reduced pressure (see Japanese Patent Examined Publication No. 59-3740), but a special and expensive apparatus is required for such practice.

Under these circumstances, interests have been shown again recently toward solution coating methods such as dip coating, roll coating, curtain coating, etc. These coating methods, however, have problems of difficulty in controlling film thickness, unsatisfactory uniformity of film thickness, formation of pin-holes, etc.

In the efforts for overcoming these problems, several proposals have been made on positive type photosensitive electrodeposition coating materials which are considered useful for producing printed circuit boards having through-holes. However, these coating materials, in most of which a quinonediazido group is used as photosensitive group, still had problems such as low photosensitivity. So, a new proposal has been made on an electrodeposition coating material containing a chemically amplified positive type photosensitive material comprising a combination of a compound which generates an acid upon irradiation with actinic light and a compound which has the nature of being decomposed by said generated acid and bettered in solubility in the developing solution, this coating material being far higher in photosensitivity than the conventional ones using a quinonediazido group (EP 0489560 A1).

These positive type photosensitive anionic electrodeposition coating materials, however, had a problem in that the copper ions eluted from the copper-clad laminate in the course of electrodeposition coating would form a chelate with the carboxyl group in the resist material to give rise to quasi-crosslinkage, so that when development is carried out with an alkali solution in a step after exposure, the exposed portion may not be developed sufficiently (hereinafter referred to as "underdevelopment").

SUMMARY OF THE INVENTION

The present invention has for its object to eliminate said prior art problems and to provide a positive type photosensitive anionic electrodeposition coating resin composition which is capable of forming a good resist pattern with high sensitivity and no fear of causing underdevelopment, a positive type photosensitive anionic electrodeposition coating material, an electrodeposition coating bath using said coating material, an electrodeposition coating process and a process for producing printed circuit boards.

The present invention provides a positive type photosensitive anionic electrodeposition coating resin composition comprising:

(a) a compound having a group unstable to acids;

(b) a compound which generates an acid when irradiated with actinic light; and (c) a compound represented by the formula:

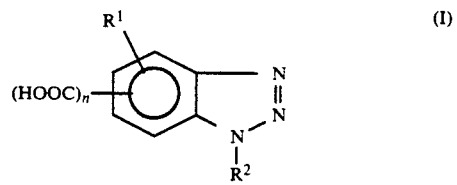

wherein $R^1$ is a hydrogen atom, a halogen atom, a hydroxyl group, an alkyl group or an alkoxy group; $R^2$ is a hydrogen atom, a hydroxyl group, an alkyl group, an ester group, a phenyl group or $-X-R^1$ (wherein X is an unsubstituted alkylene group, an alkylene group substituted with a carboxyl group, a cycloalkylene group or an alkylene ether group; and $R^3$ is a hydroxyl group, an alkoxy group, a carboxyl group or a dialkylamino group); and n is an integer of 1 to 3, but n may be 0 when $R^2$ is a group containing a carboxyl group, and/or the formula:

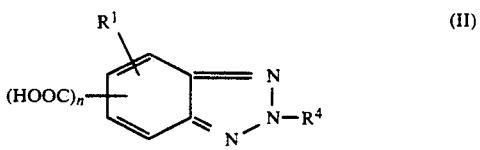

wherein $R^1$ is as defined above; $R^4$ is a hydrogen atom, an alkyl group or a phenyl group; and n is an integer of 1 to 3.

The present invention also provides a positive type photosensitive anionic electrodeposition coating material obtained by neutralizing the above-described positive type photosensitive anionic electrodeposition coating resin composition.

The present invention further provides an electrodeposition coating bath containing said positive type photosensitive anionic electrodeposition coating material.

The present invention still further provides an electrodeposition coating method which comprises dipping a substrate whose surface is electroconductive in the above-described electrodeposition coating bath and applying a DC voltage with said substrate used as anode, and a process for producing a printed circuit board, which comprises exposing the electrodeposition coating film formed on a substrate by the above-described method to light, and developing the film.

DESCRIPTION OF THE PREFERRED EMBODIMENTS

The positive type photosensitive anionic electrodeposition coating resin composition according to this invention contains, as the component (a), a compound having a group unstable to acids. This compound includes various types of compounds which can be used as far as they have at least one group unstable to acids in the molecule. Examples of the groups unstable to acids are t-butoxycarbonyl, t-amyloxycarbonyl, isobornyloxycarbonyl, t-butyl carbonate, t-amyl carbonate, isobornyl carbonate, trimethylsiloxy, tetrahydrofuranyl, tetrahydropyranyl, acetal, ketal, orthoester and enolether. Of these groups unstable to acids, the t-amyloxycarbonyl group is especially preferred in view of photosensitivity and stability.

In case of using a polymeric compound as the compound having a group unstable to acids (component (a)), it is preferable to use a polymer obtained by copolymerizing a polymerizable monomer having a group unstable to acids in the molecule and a monomer containing a carboxyl group such as acrylic acid or methacrylic acid. Examples of the polymerizable monomers having a group unstable to acids are t-butyl acrylate, t-butyl methacrylate, t-amyl acrylate, t-amyl methacrylate, isobornyl acrylate, isobornyl methacrylate, tetrahydrofuranyl acrylate and tetrahydropyranyl methacrylate. Of these monomers, t-amyl acrylate and t-amyl methacrylate are preferred.

The amount of the polymerizable monomer having a group unstable to acids to be used for the copolymerization is preferably not less than 10 parts by weight per 100 parts by weight of the total monomers constituting the copolymer. When the amount of said monomer is less than 10 parts by weight, the obtained composition tends to lower photosensitivity. The amount of the carboxyl group-containing monomer such as acrylic acid or methacrylic acid is preferably 2 to 35 parts by weight, more preferably 5 to 25 parts by weight, per 100 parts by weight of the total monomers constituting the copolymer. When the amount of acrylic or methacylic acid is less than 2 parts by weight, the obtained resin composition proves to be poor in water dispersibility and also tends to be deteriorated in stability and electrodepositing properties. When its amount exceeds 35 parts by weight, there is noted a tendency to reduce uniformity of the coating film and its resistance to developing solution.

The polymers usable as component (a) in this invention may further include those obtained by copolymerizing with other copolymerizable monomers. Examples of such other copolymerizable monomers are methyl methacrylate, ethyl methacrylate, n-butyl methacrylate, 2-ethylhexyl methacrylate, lauryl m.athacrylate, benzyl methacrylate, cyclohexyl methacrylate, ethyl acrylate, n-butyl acrylate, 2-ethylhexyl acrylate, lauryl acrylate, benzyl acrylate, cyclohexyl acrylate, 2-hydroxyethyl methacrylate, 2-hydroxyethyl acrylate, acrylonitrile, styrene, α-methylstyrene, diacetoneacrylamide and vinyltoluene. These monomers can be used alone or in combination. The amount of such other copolymerizable monomer(s) to be used for the copolymerization is preferably not more than 80 parts by weight per 100 parts by weight of the total monomers constituting the copolymer. When the amount of said monomer exceeds 80 parts by weight, the obtained composition tends to lower photosensitivity.

Among the polymeric compounds usable as the compound having a group unstable to acids, or component (a), the most preferred is a copolymer of acrylic acid or methacrylic acid, t-amyl acrylate and/or t-amyl methacrylate, and other copolymerizable monomer(s).

Said copolymer can be synthesized by ordinary solution polymerization of said polymerizable monomers in an organic solvent using a polymerization initiator such as azobisisobutyronitrile, azobisdimethylvaleronitrile, benzoyl peroxide and the like. As the organic solvent, there can be used, for example, methoxyethanol, ethoxyethanol, methoxypropanol, propoxypropanol, toluene, xylene, methyl ethyl ketone, methyl isobutyl ketone, cyclohexanol, butyl acetate, ethyl acetate, chlorobenzene, dioxane and the like. These copolymers preferably have a weight average molecular weight in the range of 5,000 to 150,000. When the weight average molecular weight is less than 5,000, there is a tendency to make mechanical strength of the resist weak, while when the molecular weight exceeds 150,000, it shows a tendency that the solution viscosity becomes too high, making it difficult to obtain a thin and uniform coating film (photosensitive film).

The weight average molecular weight shown in the present specification of the invention is the value determined by gel permeation chromatography and converted to standard polystyrene.

In case the polymeric compound having a group unstable to acids is a homopolymer made of a polymerizable monomer having a group unstable to acids in the molecule such as mentioned above or a copolymer of a polymerizable monomer having a group unstable to acids such as mentioned above and a monomer having no carboxyl group such as above-mentioned other copolymerizable monomer, and has no carboxyl group, it is necessary to use a bonding agent having a carboxyl group in view of water dispersibility, electrodepositing properties and film forming properties. High-molecular weight compounds having acrylic acid or methacrylic acid as copolymerization reactant are preferably used as the bonding agent. Such high-molecular weight compounds may be those obtained by further copolymerizing with other copolymerizable monomers. As examples of said other copolymerizable monomers, there can be cited methyl methacrylate, ethyl methacrylate, n-butyl methacrylate, 2-ethylhexyl methacrylate, lauryl methacrylate, benzyl methacrylate, cyclohexyl methacrylate, ethyl acrylate, n-butyl acrylate, 2-ethylhexyl acrylate, lauryl acrylate, benzyl acrylate, cyclohexyl acrylate, 2-hydroxyethyl methacrylate, 2-hydroxyethyl acrylate, acrylonitrile, styrene, α-methylstyrene, diacetoneacrylamide, vinyltoluene and the like. These monomers may be used either singly or in combination.

The copolymerization amount of acrylic acid or methacrylic acid in the bonding agent having a carboxyl group is preferably 2 to 35 parts by weight, more preferably 5 to 25 parts by weight, per 100 parts by weight of the whole monomers constituting the copolymer. When said copolymerization amount is less than 2 parts by weight, the obtained resin composition is poor in water dispersibility and may also be deteriorated in stability and electrodepositing properties. When the copolymerization amount exceeds 35 parts by weight, there arises a tendency to show deterioration of uniformity of coating film and its resistance to developing solution. The bonding agent can be synthesized in the same way as the synthesis of said copolymers. The weight average molecular weight of the bonding agent is preferably in the range of 5,000 to 150,000. When the weight average molecular weight is less than 5,000, mechanical strength of the resist tends to become low, and when it exceeds 150,000, the solution viscosity tends to become too high, making it unable to obtain a thin and uniform coating film (photosensitive film).

The amount of the bonding agent to be used for said purpose is preferably 30 to 90 parts by weight per 00 parts by weight of the total of the polymeric compound having a group unstable to acids in the molecule and having no carboxyl group and the bonding agent. When the amount of the bonding agent is less than 30 parts by weight, the obtained resin composition is poor in water dispersibility, and when it exceeds 90 parts by weight, the composition tends to lower photosensitivity.

In case of using a low-molecular weight compound as the compound having a group unstable to acids in the molecule, it is necessary to use a bonding agent having a carboxyl group such as mentioned above in view of water dispersibility, electrodepositing properties and film forming properties of the obtained composition.

Examples of the low-molecular weight compounds referred to herein include the compounds represented by the following formulae:

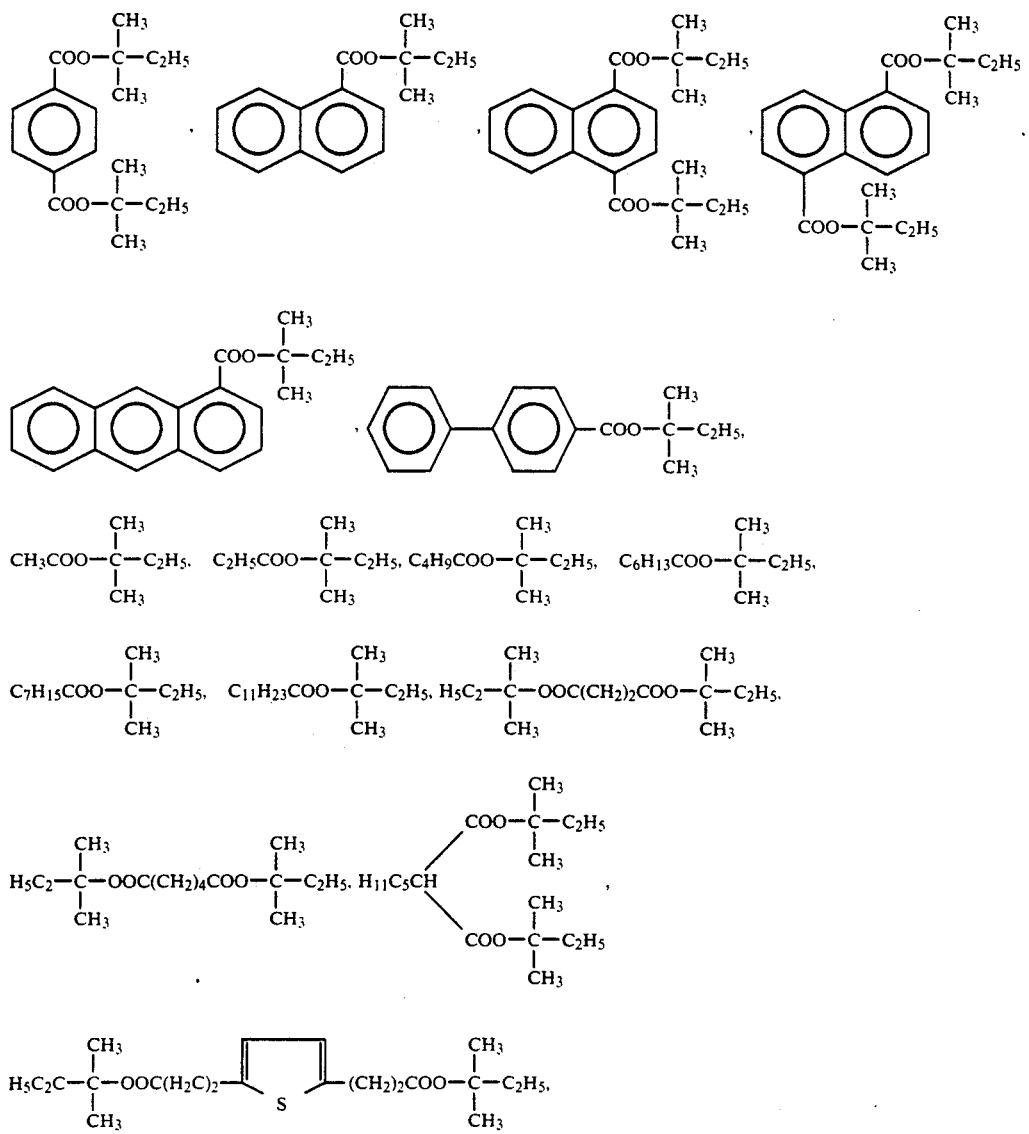

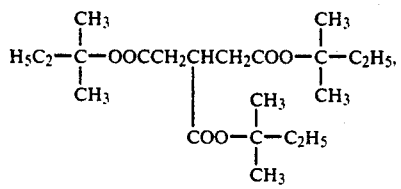
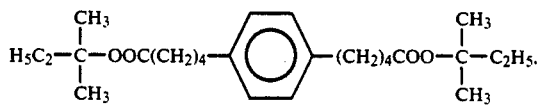
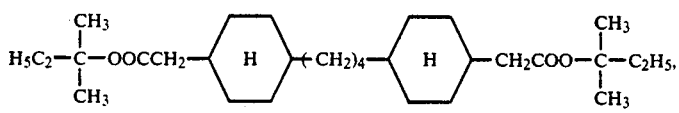
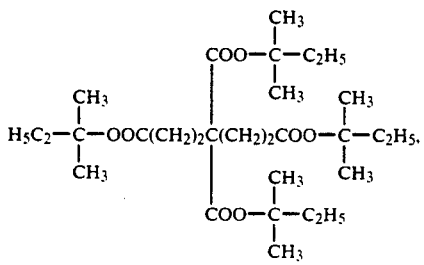
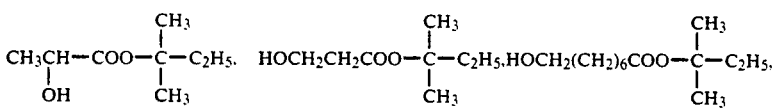
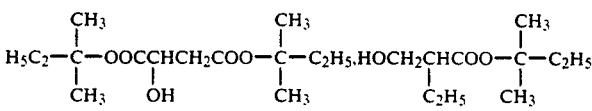
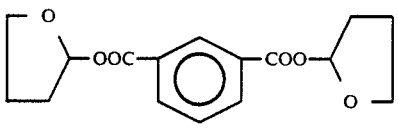
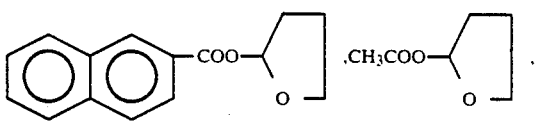
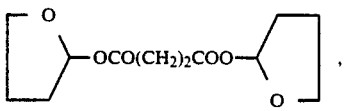
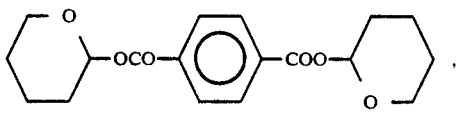
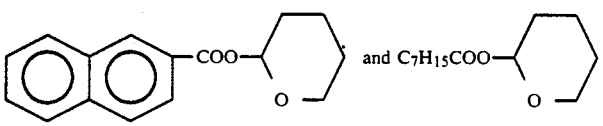
In this case, the amount of the bonding agent to be used is preferably 30 to 90 parts by weight per 100 parts by weight of the total of the low-molecular weight compound having a group unstable to acids in the molecule and the bonding agent. When the amount of the bonding agent is less than 30 parts by weight, the obtained resin composition tends to be poor in water dispersibility, and when it exceeds 90 parts by weight, the composition tends to be lowered in photosensitivity.

It is also recommendable to use as said bonding agent a high-molecular weight compound obtained by copolymerizing essentially a polymerizable monomer having a group unstable to acids in the molecule such as mentioned above and acrylic or methacrylic acid as a carboxyl group-containing monomer. In this case, the amount of the high-molecular weight compound used as the bonding agent having a carboxyl group may exceed 90 parts by weight per 100 parts by weight of the total of the low-molecular weight compound and the bonding agent.

The compound having a group unstable to acids in the molecule (the component (a)) is used in an amount of preferably 50 to 99.5 parts by weight, more preferably 70 to 98 parts by weight, per 100 parts by weight of a total of said compound (a) and the compound which generates an acid when exposed to actinic light (the component (b)). When the amount is less than 50 parts by weight, the content of the compound (b) generating an acid when exposed to actinic light tends to become too high, causing a reduction of stability of the product, and when the amount exceeds 99.5 parts by weight, there is a tendency for the product to lower photosensitivity.

The resin composition according to the present invention also contains, as component (b), a compound which generates an acid when exposed to actinic light, i.e. a photoacid generator.

Typical examples of such compounds are: oxadiazole derivatives substituted with a trihalomethyl group, such as:

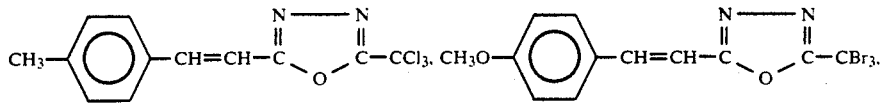

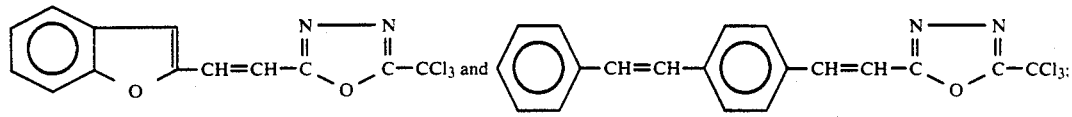

s-triazine derivatives substituted with a trihalomethyl group, such as:

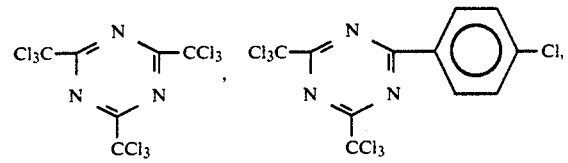

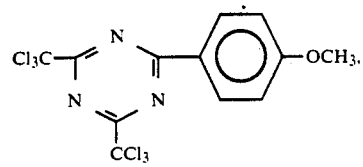

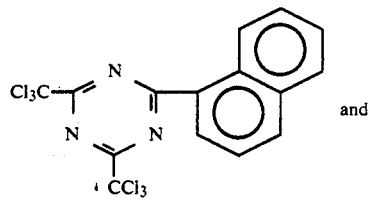

and

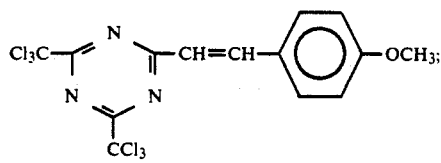

iodonium salts such as

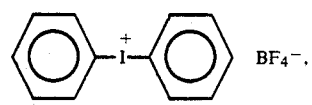 BF$_4^-$,

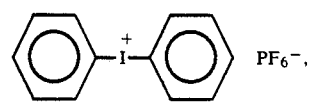 PF$_6^-$,

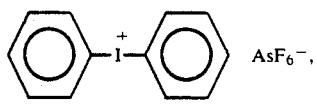 AsF$_6^-$,

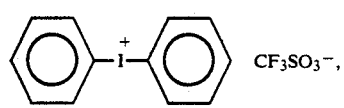 SbF$_6^-$

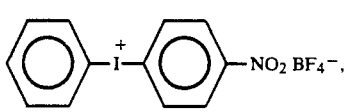 CF$_3$SO$_3^-$,

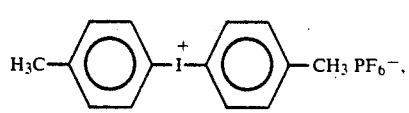

-continued
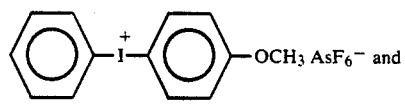
sulfonium salts such as:
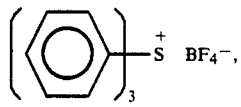
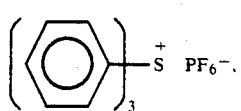
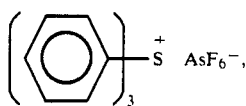
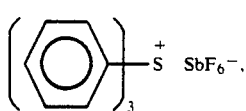
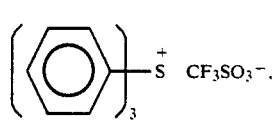
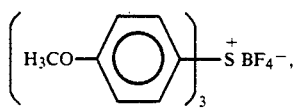
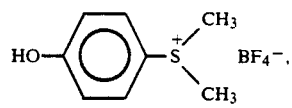
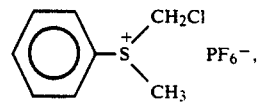
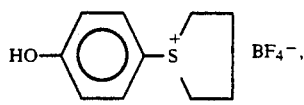
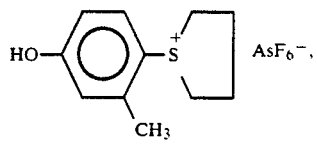
-continued
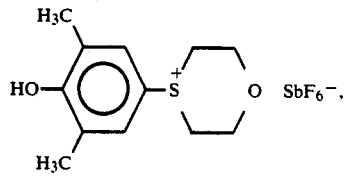
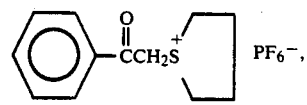
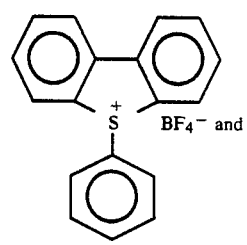
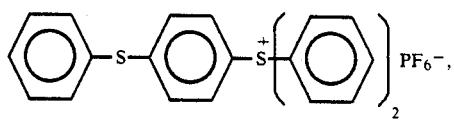
disulfone derivatives such as:
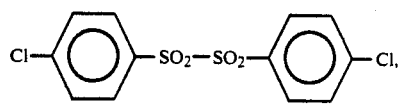
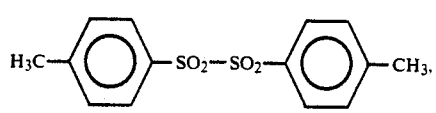
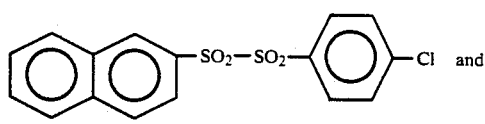
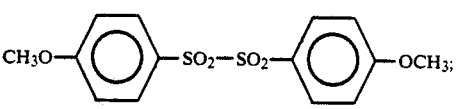
and imidosulfonate derivatives such as:
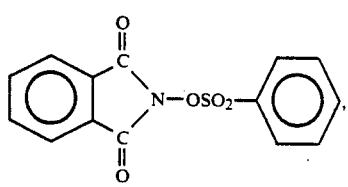

-continued
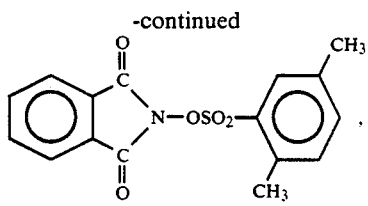
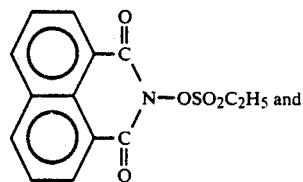
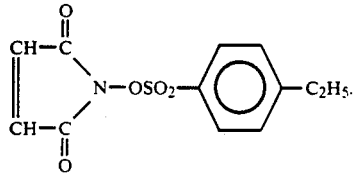
Of these compounds, the nitrobenzyl derivatives represented by the following formula III or IV are preferred:
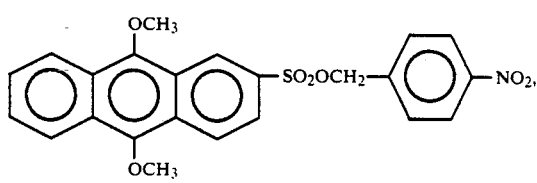  (III)
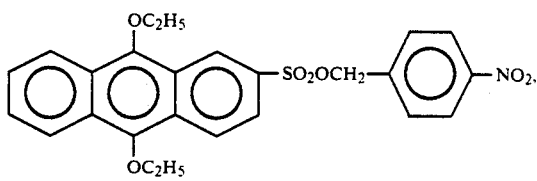  (IV)
wherein R is an alkyl group. Typical examples of these compounds are shown below by way of chemical formula:
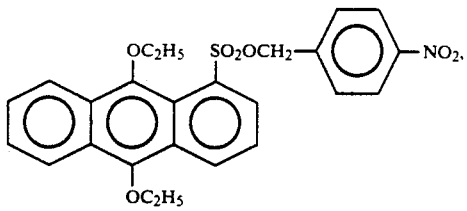
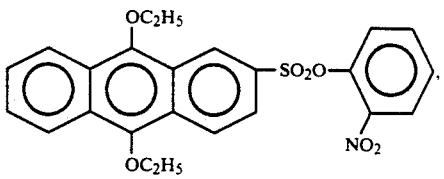
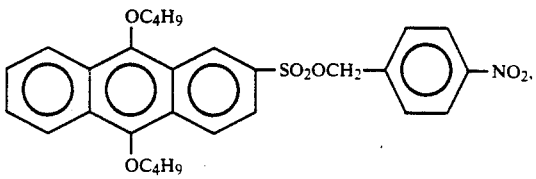

-continued

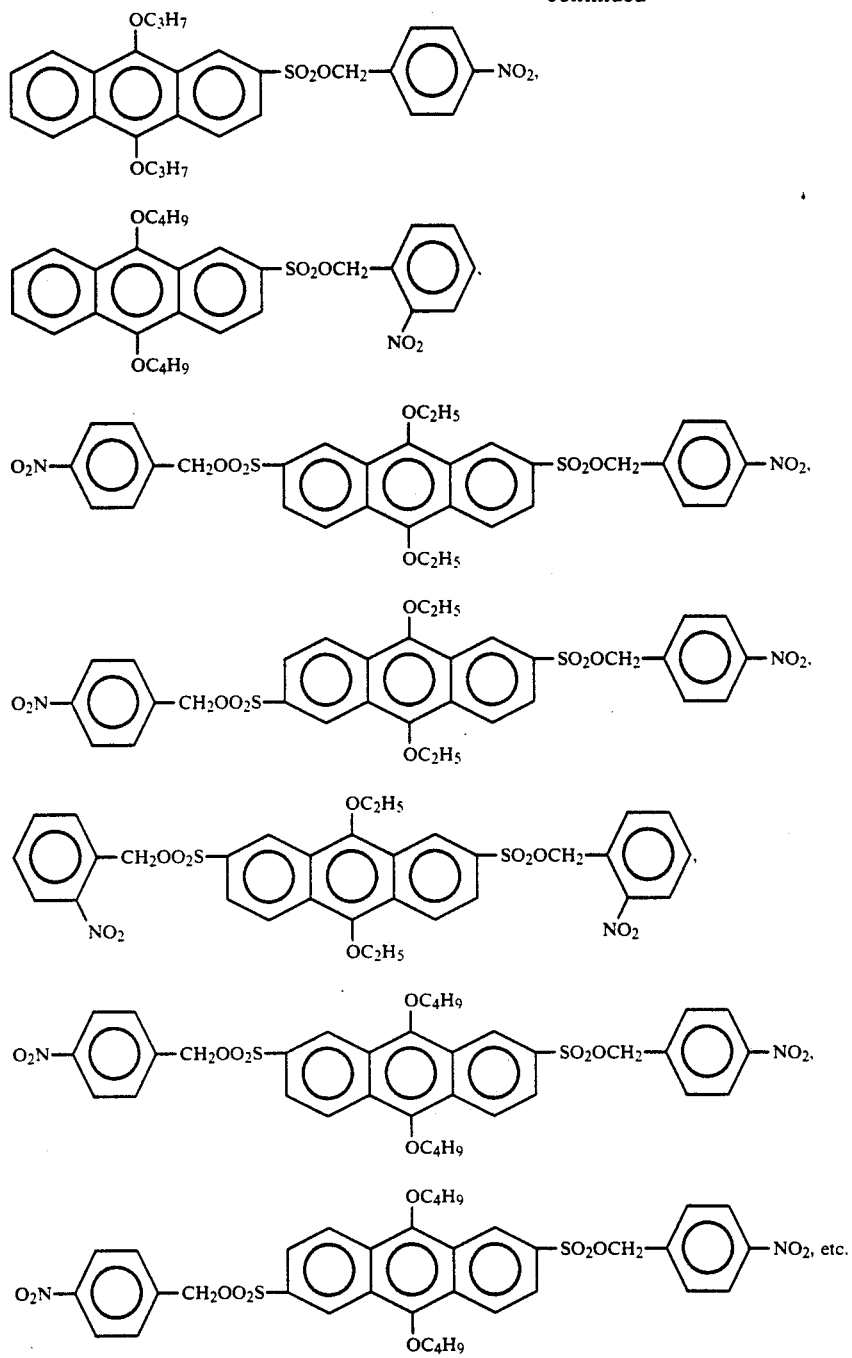

The compound (b) generating an acid when exposed to actinic acid is used in an amount of preferably 0.5 to 50 parts by weight, more preferably 2 to 30 parts by weight, per 100 parts by weight of the total of the compound (a) having a group unstable to acids in the molecule and the compound (b) generating an acid when exposed to actinic acid. When the amount is less than 0.5 part by weight, photosensitivity tends to lower, and when the amount exceeds 50 parts by weight, stability of the product tends to be lowered.

The resin composition according to the present invention also contains, as component (c), at least one of the compounds represented by the following formulae (I)'s and (II)'s:

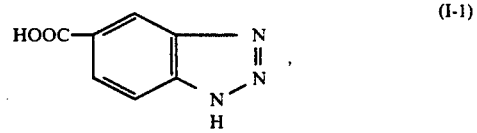
(I-1)

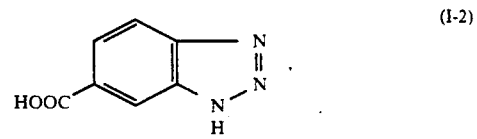
(I-2)

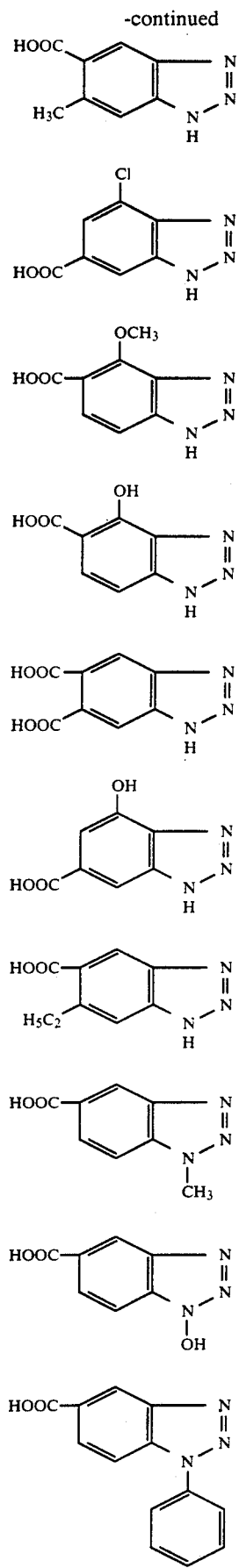
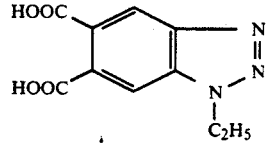
(I-13)
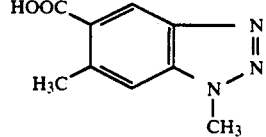
(I-14)
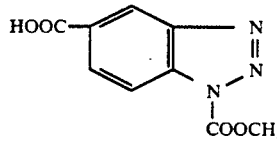
(I-15)
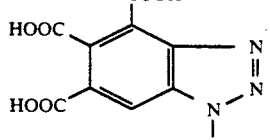
(I-16)
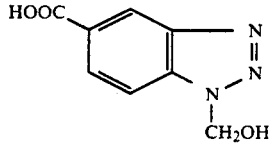
(I-17)
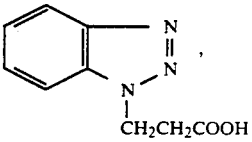
(I-18)
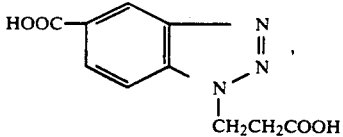
(I-19)
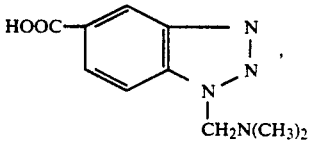
(I-20)
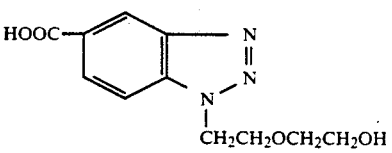
(I-21)

-continued (I-22) 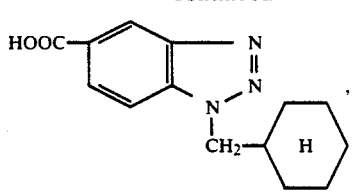

(I-23) 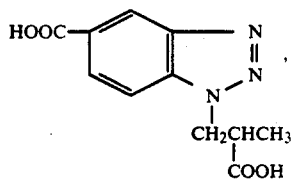

(I-24) 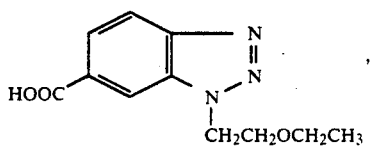

(I-25) 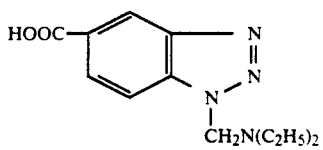

(I-24) 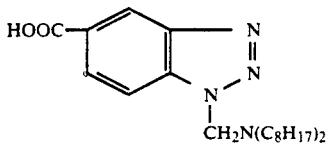

(I-27) 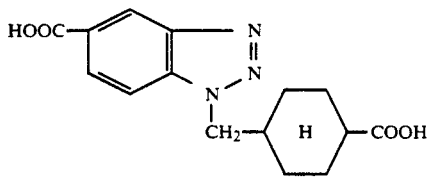

(I-28) 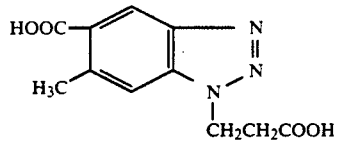

(II-1) 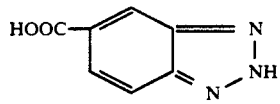

(II-2) 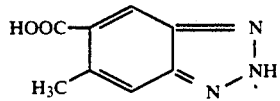

(II-3) 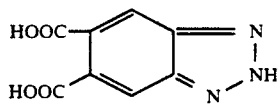

(II-4) 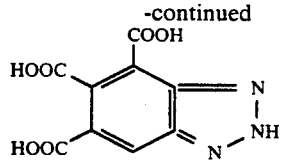

(II-5) 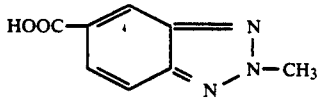

(II-6) 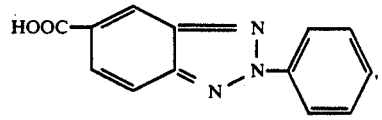

(II-7) 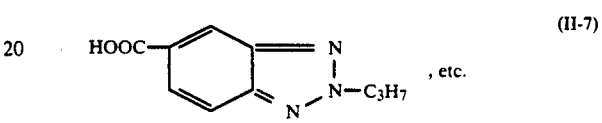, etc.

These compounds (c) may be used either singly or in combination. The content (total) of the compound(s) of the formula (I) and/or (II) is preferably in the range of 0.1 to 15 parts by weight, more preferably 0.5 to 8 parts by weight, per 100 parts by weight of the positive type photosensitive anionic electrodeposition coating resin composition comprising the components (a), (b) and (c). When the content is less than 0.1 part by weight, the effects of the compound to overcome underdevelopment and to improve electrodepositing properties tend to be insufficient, and when the content exceeds 15 parts by weight, stability of the electrodeposition bath tends to be deteriorated.

The positive type photosensitive anionic electrodeposition coating resin composition of this invention may further contain one or more appropriate additives such as sensitizers, dyes, pigments, plasticizers, adhesion promoters, surface lubricants, dispersants, inorganic fillers and the like.

For preparing an electrodeposition coating material from the above-described resin composition according to this invention, preferably said respective components are first uniformly dissolved in a hydrophilic organic solvent. This is, however, not essential. As the hydrophilic organic solvent, there can be used dioxane, methoxyethanol, ethoxyethanol, diethylene glycol and the like, either singly or in combination. The organic solvent is used preferably in an amount of 300 parts by weight or less per 100 parts by weight of the total solid components.

Then, a base is added to the resulting solution to neutralize the carboxyl group contained in the polymer. This facilitates dissolution or dispersion of the composition in water to give a positive type photosensitive anionic electrodeposition coating composition.

As the base, there can be used, for example, triethylamine, monoethanolamine, diethanolamine, diisopropylamine, dimethylaminoethanol, morpholine, ammonia, sodium hydroxide and the like, either singly or in combination.

The base is used in an amount of preferably 0.4 to 1.0 equivalent per equivalent of the carboxyl group in the polymer. When the amount of the base is less than 0.4 equivalent, water dispersion stability in the electrodeposition coating bath tends to lower, and when the amount exceeds 1.0 equivalent, the electrodeposited coating film (photosensitive layer) may become too small in thickness and storage stability of the product is deteriorated.

Then, the coating composition thus obtained is dissolved or dispersed in water to prepare an electrodeposition coating bath. The electrodeposition coating bath has a solid content of usually 5 to 20% by weight, and its pH is preferably in the range of 6.0 to 9.0. When pH is less than 6.0, dispersion may be disturbed to retard electrophoresis. When pH is higher than 9.0, the once electrodeposited film may be re-dissolved, and consequently there may not be formed a film at all. In order to maintain the pH in the above-defined preferable range, a base such as mentioned above may be added later for adjustment of pH.

A surfactant such as nonionic, cationic or anionic surfactant may be properly added for enhancing water dispersibility or dispersion stability of the positive type photosensitive anionic electrodeposition coating resin composition. A hydrophobic solvent such as toluene, xylene, 2-ethylhexyl alcohol or the like may also be added for increasing the build-up in electrodeposition.

For carrying out electrodeposition coating on the surface of a substrate (in this case, at least the substrate surface should be clad with a metal such as iron, aluminum, copper, zinc or the like, or an alloy of such metals so that the substrate surface will be electroconductive) by using the electrodeposition coating bath obtained in the manner described above, the substrate is dipped in the electrodeposition coating bath and a DC voltage of 50 to 400 V is applied, with the substrate serving as anode, for a period of 10 seconds to 5 minutes. In this operation, the temperature of the electrodeposition coating bath is preferably controlled to be kept at 15° to 30° C.

After this electrodeposition coating operation, the coated material is taken out of the coating bath, washed with water, drained and dried with hot air or other means. It is to be noted that too high drying temperature could cause decomposition of the group unstable to acids in the coating composition, so that usually drying is performed at a temperature below 110° C.

The thickness of the thus obtained coating film (photosensitive layer) is preferably 2 to 50 $\mu$m. When the film thickness is less than 2 $\mu$m, the film tends to be poor in resistance to developer, and in case of using the coating film for the production of printed circuit boards, resistance to etching solution and etch factor tend to become too low when the formed resist pattern is subjected to etching treatment. When the film thickness exceeds 50 $\mu$m, resolution of resist pattern sometimes lowers.

The coating film is then irradiated imagewise with actinic light to generate an acid at the exposed portion, and if necessary heated at 80° to 150° C. for 1 to 20 minutes, and then developed for removing the exposed portion to obtain a resist pattern.

As the light source of actinic light, it is recommended to use one which can emit light of 300 to 450 nm in wavelength, such as mercury vapor arc, carbon arc, xenone arc and the like.

Development can usually be carried out by spraying an alkaline aqueous solution of sodium hydroxide, sodium carbonate, potassium hydroxide or the like, or by dipping in the alkaline aqueous solution.

In the present invention, the compounds represented by formulae (I) and (II) (benzotriazole derivatives having a carboxyl group), which are used as component (c), work for eliminating underdevelopment and bettering electrodepositing properties, can act as a sensitizer and also contribute to the improvement of photosensitivity.

The present invention is further illustrated with reference to the Examples and Comparative Examples. It is to be understood, however, that the following Examples are merely intended to be illustrative and not to be construed as limiting the scope of the invention.

SYNTHESIS EXAMPLE 1

In a flask equipped with a stirrer, a reflux condenser, a thermometer, a dropping funnel and a nitrogen introducing pipe, 1,130 g of propylene glycol monomethyl ether was placed and heated to 90° C. with stirring while introducing a nitrogen gas thereinto. When the temperature became constant at 90° C., a mixed solution of 100 g of methacrylic acid, 650 g of tertamyl methacrylate, 250 g of n-butyl acrylate and 10 g of azobisisobutyronitrile was added dropwise into the flask over a period of 3 hours, followed by stirring at 90° C. for 3 hours. Then, a solution prepared by dissolving 3 g of azobisdimethylvaleronitrile in 100 g of propylene glycol monomethyl ether was added dropwise into the flask over a period of 10 minutes, followed by stirring at 90° C. for 4 hours.

The thus obtained copolymer (hereinafter called P-1) had a weight average molecular weight of 38,000 and an acid number of 65. The solid content of the copolymer (P-1) solution was 45.1% by weight.

SYNTHESIS EXAMPLES 2

In the same flask as used in Synthesis Example 1, 1,130 g of propylene glycol monomethyl ether was placed and heated to 90° C. with stirring while introducing a nitrogen gas thereinto. When the temperature became constant at 90° C., a mixed solution of 77 g of methacrylic acid, 310 g of tert-amyl methacrylate, 450 g of 2-ethylhexyl acrylate, 163 g of methyl methacrylate and 7 g of azobisisobutyronitrile was added dropwise into the flask over a period of 3 hours, followed by stirring at 90° C. for 3 hours. Then a solution prepared by dissolving 3 g of azobisdimethylvaleronitrile in 100 g of propylene glycol monomethyl ether was added dropwise into the flask over a period of 10 minutes, followed by stirring at 90° C. for 4 hours.

The thus obtained copolymer (hereinafter called P-2) had a weight-average molecular weight of 45,000 and an acid number of 50.2. The solid content of the copolymer (P-2) solution was 45.3% by weight.

SYNTHESIS EXAMPLE 3

In the same flask as used in Synthesis Example 1, 1,130 g of propylene glycol monopropyl ether was placed and heated to 80° C. with stirring while introducing a nitrogen gas. When the temperature became constant at 80° C., a mixed solution of 48 g of acrylic acid, 500 g of isobornyl methacrylate, 359 g of 2-ethylhexyl acrylate and 10 g of azobisisobutyronitrile was added dropwise into the flask over a period of 3 hours, followed by stirring at 80° C. for 4 hours. Then a solution prepared by dissolving 3 g of azobisdimethylvaleronitrile in 100 g of propylene glycol monopropyl ether was added dropwise into the flask over a period of 10 minutes, followed by stirring at 80° C. for 6 hours.

The thus obtained copolymer (hereinafter called P-3) had a weight-average molecular weight of 51,000 and an acid number of 60.1. The solid content of the copolymer (P-3) solution was 44.7% by weight.

EXAMPLE 1

To 221 g of the copolymer (P-1) solution were added 8 g of p-nitrobenzyl-9,10-diethoxyanthracene-2-sulfonate and 1 g of a benzotriazole derivative (I-1), followed by addition of 9.5 g of triethylamine for neutralizing the mixed solution. Then 780 g of distilled water was added dropwise to the solution with stirring to give an electrodeposition coating bath (pH 7.8).

EXAMPLE 2

To 221 g of the copolymer (P-2) solution were added 7 g of p-nitrobenzyl-9,10-dipropoxyanthracene-2-sulfonate and 2 g of a benzotriazole derivative (I-26), followed by addition of 8.0 g of triethylamine for neutralizing the solution. Then 770 g of distilled water was added dropwise to the solution with stirring to give an electrodeposition coating bath (pH 7.5).

EXAMPLE 3

To 224 g of the copolymer (P-3) solution were added 8 g of p-nitrobenzyl-9,10-dipropoxyanthracene-2-sulfonate and 1 g of a benzotriazole derivative (I-1), followed by addition of 7.0 g of triethylamine for neutralization. Then 800 g of distilled water was added dropwise to the solution with stirring to give an electrodeposition coating bath (pH 7.8).

EXAMPLE 4

To 221 g of the copolymer (P-1) solution were added 3 g of di-t-amyl terephthalate, 8 g of p-nitrobenzyl-9,10-dipropoxyanthracene-2-sulfonate and 1 g of a benzotriazole derivative (I-1), followed by addition of 7.0 g of triethylamine for neutralizing the solution. Then 820 g of distilled water was added dropwise to the solution with stirring to give an electrodeposition coating bath (pH 7.8).

EXAMPLE 5

To 221 g of the copolymer (P-1) solution were added 1 g of 2-(p-methoxyphenyl)-4,6-bis(trichloromethyl)-s-triazine, 5 g of p-nitrobenzyl-9,10-diethoxyanthracene-2-sulfonate and 1 g of a benzotriazole derivative (I-1), followed by addition of 9.5 g of triethylamine for neutralizing the solution. Then 780 g of distilled water was added dropwise to the solution with stirring to give an electrodeposition coating bath (pH 7.6).

EXAMPLE 6

To 221 g of the copolymer (P-1) solution were added 3 g of triphenylsulfonium hexafluoroantimonate and g of a benzotriazole derivative (I-1), followed by addition of 9.5 g of triethylamine for neutralizing the solution. Then 770 g of distilled water was added dropwise to the solution with stirring to give an electrodeposition coating bath (pH 7.9).

EXAMPLE 7

To 221 g of the copolymer (P-2) solution were added 1 g of 2-(p-methoxystyryl)-4,6-bis(trichloromethyl)-s-triazine, 7 g of p-nitrobenzyl-9,10-dipropoxyanthracene-2-sulfonate and 2 g of a benzotriazole derivative (I-26), followed by addition of 8.0 g of triethylamine. Then 770 g of distilled water was added dropwise to the solution with stirring to give an electrodeposition coating bath (pH 7.5).

EXAMPLE 8

To 221 g of the copolymer (P-2) solution were added 3 g of diphenyliodium hexafluoroantimonate and 2 g of a benzotriazole derivative (I-26), followed by addition of 8.0 of triethylamine for neutralizing the solution. Then 770 g of distilled water was added dropwise to the solution with stirring to give an electrodeposition coating bath (pH 7.5).

COMPARATIVE EXAMPLE 1

An electrodeposition coating bath was obtained in the same way as Example 1 except that no benzotriazole derivative (I-1) was used.

COMPARATIVE EXAMPLE 2

An electrodeposition coating bath was obtained in the same way as Example 2 except that no benzotriazole derivative (I-26) was used.

COMPARATIVE EXAMPLE 3

An electrodeposition coating bath was obtained in the same way as Example 1 except that merely 5 g of benzotriazole having no carboxyl group was used in place of the benzotriazole derivative (I-1).

In each of the electrodeposition coating baths obtained in Examples 1–8 and Comparative Examples 1–3, a copper-clad glass epoxy laminate (KCL-E-61 mfd. by Hitachi Chemical Company, Ltd.) serving as anode and a stainless steel plate (SUS 304, 200 mm×75 mm×1 mm) serving as cathode were dipped. A DC voltage was applied for 3 minutes at 25° C. to form an electrodeposited coating film (photosensitive film) on the surface of the copper-clad laminate, which was then washed with water, drained and dried at 80° C. for 15 minutes. The relation between applied voltage and thickness of the formed electrodeposited coating film is shown in Table 1.

Next, each of the coating films was exposed to light imagewise vis a photoresist mask using a 3 kW ultra-high pressure mercury lamp, followed by heating at 130° C. for 10 minutes in an oven and development with an aqueous solution of 1 wt % sodium carbonate. For evaluating the photosensitivity of each coating film, the exposure required for obtaining the 4th step in the Step Tablet was measured. The results are shown in Table 1. Also, for confirming the presence or absence of underdevelopment, the substrate after development was dipped in a 1 wt % copper chloride solution for one minute and the degree of etching (etching properties) of the substrate at its non-exposed portion was visually observed. The results are also shown in Table 1.

TABLE 1

| | Component (a) | Component (b) |
|---|---|---|
| Example 1 | P-1 | p-nitrobenzyl-9,10-diethoxyanthracene-2-sulfonate |
| Example 2 | P-2 | p-nitrobenzyl-9,10-dipropoxyanthracene-2-sulfonate |
| Example 3 | P-3 | p-nitrobenzyl-9,10-dipropoxyanthracene-2-sulfonate |
| Example 4 | P-1 | p-nitrobenzyl-9,10-dipropoxyanthracene-2-sulfonate |
| Example 5 | P-1 | p-nitrobenzyl-9,10-diethoxyanthracene-2-sulfonate 2-(p-methoxyphenyl)-4,6-bis(trichloromethyl)-s-triazine |

TABLE 1-continued

| | | |
|---|---|---|
| Example 6 | P-1 | triphenylsulfonium hexafluoroantimonate |
| Example 7 | P-2 | p-nitrobenzyl-9,10-dipropoxyanthracene-2-sulfonate<br>2-(p-methoxystyryl)-4,6-bis(trichloromethyl)-s-triazine |
| Example 8 | P-2 | diphenyliodium hexafluoroantimonate |
| Comp. Example 1 | P-1 | p-nitrobenzyl-9,10-diethoxyanthracene-2-sulfonate |
| Comp. Example 2 | P-2 | p-nitrobenzyl-9,10-dipropoxyanthracene-2-sulfonate |
| Comp. Example 3 | P-1 | p-nitrobenzyl-9,10-diethoxyanthracene-2-sulfonate |

| Component (c) | Applied voltage (V) | Thickness of electro-deposited film (μm) | Exposure (mJ/cm$^2$) | Etching properties* |
|---|---|---|---|---|
| I-1 | 100 | 8.0 | 150 | o |
| I-26 | 90 | 8.5 | 160 | o |
| I-1 | 100 | 8.0 | 185 | o |
| I-1 | 80 | 7.5 | 120 | o |
| I-1 | 100 | 7.5 | 140 | o |
| I-1 | 100 | 8.0 | 125 | o |
| I-26 | 90 | 8.0 | 150 | o |
| I-26 | 90 | 7.5 | 130 | o |
| None | 180 | 6.0 | 250 | x |
| None | 170 | 5.5 | 200 | x |
| benzo-triazole | 180 | 6.0 | 250 | xx |

*: good (no underdevelopment)
x: bad (some underdevelopment left)
xx: very bad (much underdevelopment)

From the results shown in Table 1, it is seen that when using the compositions of Examples 1-8 containing a benzotriazole derivative having a carboxyl group, there can be obtained the same coating film thickness at lower voltage and also the electrodepositing properties are improved as compared with use of the compositions of Comparative Examples 1-2 in which no said benzotriazole derivative is contained. Further, higher photosensitivity can be obtained by using the compositions of Examples 1-8 than when using the compositions of Comparative Examples 1-2. As for underdevelopment, in the case of Comparative Examples 1-2, etching is not made perfectly, causing partial underdevelopment, while in the case of Examples 1-8 according to this invention, etching is made perfectly, leaving no trace of underdevelopment.

On the other hand, in Comparative Example 3 in which merely benzotriazole having no carboxyl group was added instead of a benzotriazole derivative having a carboxyl group used in the present invention, the electrodepositing properties are the same as Comparative Examples 1-2 and there is noted no effect of improving the electrodepositing properties such as seen in Examples 1-8, as shown in Table 1. As for underdevelopment, the result is rather worse than the case where no benzotriazole (derivative) is added (Comparative Examples 1-2). The effect is just contrary to that seen in the case of Examples 1-4. This indicates that the various effects seen with Examples 1-8 can not be provided by mere addition of a chelating agent, in other words, the improvements of various properties observed in Examples 1-8 are brought about by the addition of a specific compound, viz. atriazole derivative having a carboxyl group.

Needless to say, each of the resist patterns obtained with the compositions of Examples 1-8 after development had an excellent configuration with a resolution of 50 μm.

Thus, by use of the positive type photosensitive anionic electrodeposition coating resin composition, electrodeposition coating material and electrodeposition coating bath according to the present invention, the electrodepositing properties are improved and a electrodeposited coating film with high photosensitivity can be formed in comparison with the conventional products. Therefore, a substrate provided with a photosensitive layer by the electrodeposition coating method according to this invention has no risk of causing underdevelopment at the exposed portion after development, and in use thereof for the production of printed circuit boards, since a resist pattern with high resolution can be obtained, it is possible to obtain the printed circuit boards of very high quality. Also, the resist pattern formed according to this invention can be used as a relief. It is further possible to use a copper-clad laminate as substrate and apply it to formation of a photoresist for etching or plating.

What is claimed is:

1. A positive type photosensitive anionic electrodeposition coating resin composition comprising:
   (a) a compound having a group unstable to acids;
   (b) a compound generating an acid when exposed to actinic light; and
   (c) at least one member selected from the compounds of the formulae (I) and (II):

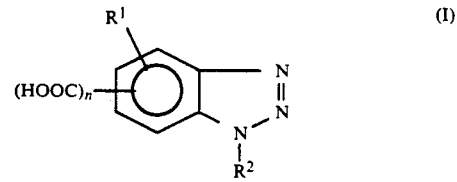

(I)

wherein $R^1$ is a hydrogen atom, a halogen atom, a hydroxyl group, an alkyl group or an alkoxy group; $R^2$ is a hydrogen atom, a hydroxyl group, an alkyl group, an ester group, a phenyl group or a group of the formula $-X-R^3$; X is an unsubstituted alkylene group, an alkylene group substituted with a carboxyl group, a cycloalkylene group or an alkylene ether group; $R^3$ is a hydroxyl group, an alkoxy group, a carboxyl group or a dialkylamino group; and n is an integer of 1 to 3, but when $R^2$ is a group containing a carboxyl group, n may be 0;

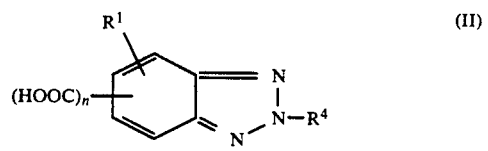

(II)

wherein $R^1$ is as defined above; $R^4$ is a hydrogen atom, an alkyl group or a phenyl group; and n is an integer of 1 to 3.

2. A composition according to claim 1, wherein the group unstable to acids in the component (a) is t-amyloxycarbonyl group.

3. A positive type photosensitive anionic electrodeposition coating material obtained by neutralizing the positive type photosensitive anionic electrodeposition coating resin composition of claim 1.

4. An electrodeposition coating bath containing the positive type photosensitive anionic electrodeposition coating material of claim 3.

5. An electrodeposition coating method comprising dipping an electroconductive substrate in the electrodeposition coating bath of claim 4 and applying a DC voltage to said substrate serving as anode.

6. A process for producing a printed circuit board which comprises exposing a coating film formed on a substrate by electrodeposition according to the method of claim 5 and developing a film.

7. A composition according to claim 1, wherein the component (a) is a compound having one or more t-butyoxcarbonyl groups, t-amyloxycarbonyl groups, isobornyloxycarbonyl groups, t-butylcarbonate groups, t-amylcarbonate groups, isobornylcarbonate groups, trimethylsiloxy groups, tetrahydrofuranyl group, tetrahydropyranyl groups, acetal groups, ketal groups, orthoester groups, or enolether groups.

8. A composition according to claim 1, wherein the component (a) is a copolymer of acrylic acid or methacrylic acid and at least one monomer selected from the group consisting of t-butyl acrylate, t-butyl methacrylate, t-amyl acrylate, t-amyl methacrylate, isobornyl acrylate, isobornyl methacrylate, tetrahydrofuranyl acrylate and tetrahydropyranyl methacrylate.

9. A composition according to claim 1, wherein the component (b) is an oxadiazole derivative, an s-triazine derivative, an iodonium salt, a sulfonium salt, a disulfone derivative, an imidosulfonate derivative, or a nitrobenzyl derivative.

* * * * *